US009362143B2

(12) United States Patent
Sun et al.

(10) Patent No.: US 9,362,143 B2
(45) Date of Patent: Jun. 7, 2016

(54) METHODS FOR FORMING SEMICONDUCTOR DEVICE PACKAGES WITH PHOTOIMAGEABLE DIELECTRIC ADHESIVE MATERIAL, AND RELATED SEMICONDUCTOR DEVICE PACKAGES

(75) Inventors: Yangyang Sun, San Diego, CA (US); Michel Koopmans, Boise, ID (US); Jaspreet S. Gandhi, Boise, ID (US); Josh D. Woodland, Kuna, ID (US); Brandon P. Wirz, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 253 days.

(21) Appl. No.: 13/470,818

(22) Filed: May 14, 2012

(65) Prior Publication Data

US 2013/0299986 A1 Nov. 14, 2013

(51) Int. Cl.
*H01L 23/48* (2006.01)
*H01L 21/56* (2006.01)
(Continued)

(52) U.S. Cl.
CPC ............ *H01L 21/561* (2013.01); *H01L 21/563* (2013.01); *H01L 23/49894* (2013.01); *H01L 24/27* (2013.01); *H01L 24/29* (2013.01); *H01L 24/73* (2013.01); *H01L 24/81* (2013.01); *H01L 24/83* (2013.01); *H01L 24/92* (2013.01); *H01L 25/0657* (2013.01); *H01L 24/13* (2013.01); *H01L 2224/0401* (2013.01); *H01L 2224/05571* (2013.01); *H01L 2224/131* (2013.01); *H01L 2224/13022* (2013.01);
(Continued)

(58) Field of Classification Search
CPC .............. H01L 21/563; H01L 21/4857; H01L 21/6835; H01L 21/87; H01L 21/2007; H01L 21/2011; H01L 24/73; H01L 24/29; H01L 24/81; H01L 24/92

USPC ......... 438/106–109, 113, 455, 612, 613, 615; 257/777–779, 781–784, E21.503, 257/E21.511
See application file for complete search history.

(56) References Cited

U.S. PATENT DOCUMENTS 5,508,228 A 4/1996 Nolan et al.
6,168,972 B1 1/2001 Wang et al.
(Continued)

OTHER PUBLICATIONS

Jourdain et al., Electrically Yielding Collective Hybrid Bonding for 3D Stacking of ICs, 2009 Electronic Components and Technology Conference, May 26-29, 2009, pp. 11-13.
(Continued)

*Primary Examiner* — Brook Kebede
(74) *Attorney, Agent, or Firm* — TraskBritt

(57) ABSTRACT

Methods for forming semiconductor device packages include applying a photoimageable dielectric adhesive material to a major surface of a semiconductor die and at least partially over conductive elements on the semiconductor die. The photoimageable dielectric adhesive material may be removed from over the conductive elements. The conductive elements are aligned with and bonded to bond pads of a substrate, and the semiconductor die and the substrate are adhered with the photoimageable dielectric adhesive material. A semiconductor device package includes at least one semiconductor die including conductive structures thereon, a substrate including bond pads thereon that are physically and electrically connected to the conductive structures, and a developed photoimageable dielectric adhesive material disposed between the semiconductor die and the substrate around and between adjacent conductive structures.

26 Claims, 8 Drawing Sheets

(51) Int. Cl.
*H01L 23/498* (2006.01)
*H01L 25/065* (2006.01)
*H01L 23/00* (2006.01)

(52) U.S. Cl.
CPC .......... *H01L 2224/13082* (2013.01); *H01L 2224/13111* (2013.01); *H01L 2224/13144* (2013.01); *H01L 2224/13147* (2013.01); *H01L 2224/13169* (2013.01); *H01L 2224/13184* (2013.01); *H01L 2224/16148* (2013.01); *H01L 2224/16238* (2013.01); *H01L 2224/27416* (2013.01); *H01L 2224/27436* (2013.01); *H01L 2224/27618* (2013.01); *H01L 2224/29011* (2013.01); *H01L 2224/2929* (2013.01); *H01L 2224/73104* (2013.01); *H01L 2224/73204* (2013.01); *H01L 2224/8114* (2013.01); *H01L 2224/8182* (2013.01); *H01L 2224/81191* (2013.01); *H01L 2224/81203* (2013.01); *H01L 2224/81815* (2013.01); *H01L 2224/8388* (2013.01); *H01L 2224/83191* (2013.01); *H01L 2224/83192* (2013.01); *H01L 2224/9211* (2013.01); *H01L 2224/94* (2013.01); *H01L 2225/06513* (2013.01); *H01L 2225/06517* (2013.01); *H01L 2225/06541* (2013.01); *H01L 2225/06565* (2013.01); *H01L 2924/00014* (2013.01)

(56) References Cited

U.S. PATENT DOCUMENTS

| | | | |
|---|---|---|---|
| 6,329,222 | B1 | 12/2001 | Corisis et al. |
| 6,566,234 | B1 | 5/2003 | Capote et al. |
| 7,482,702 | B2 | 1/2009 | Farnworth et al. |
| 7,645,634 | B2 * | 1/2010 | Karnezos ............... 438/107 |
| 2002/0151164 | A1 | 10/2002 | Jiang et al. |
| 2004/0074865 | A1 * | 4/2004 | Ho et al. ............... 216/2 |
| 2011/0065241 | A1 | 3/2011 | Lin et al. |
| 2011/0115341 | A1 * | 5/2011 | Birkmeyer et al. ....... 310/364 |

OTHER PUBLICATIONS

Nimura et al., Solder/Adhesive Bonding Using Simple Planarization Technique for 3D Integration, 2011 Electronic Components and Technology, Conference, May 31, 2011-Jun. 3, 2011, pp. 1147-1152.

* cited by examiner

METHODS FOR FORMING SEMICONDUCTOR DEVICE PACKAGES WITH PHOTOIMAGEABLE DIELECTRIC ADHESIVE MATERIAL, AND RELATED SEMICONDUCTOR DEVICE PACKAGES

TECHNICAL FIELD

Embodiments of the present disclosure relate to methods for forming semiconductor device packages with photoimageable dielectric adhesive material disposed between a semiconductor die and a substrate, and to related semiconductor device packages.

BACKGROUND

In the semiconductor industry, so-called "flip-chips," as well as semiconductor dice of other configurations, may be attached to a substrate, such as a printed circuit board (PCB), interposer, or another semiconductor die, through an array of conductive elements comprising bumps, studs, columns or pillars. A dielectric underfill material may fill a gap between the semiconductor die and the substrate. FIG. 1 through 4 illustrate a conventional so-called "wafer level underfill" (WLU) method of attaching a semiconductor die 11 to a substrate 40. As shown in FIG. 1, an array of conductive elements 12 is formed on a surface of a semiconductor wafer 10 including multiple semiconductor dice 11. After the conductive elements 12 are formed on the semiconductor wafer 10, a dielectric WLU material 30 is deposited on the surface of the semiconductor wafer 10, as shown in FIG. 2. The WLU material 30 may be spin coated if in flowable form or laminated if in film form on the surface of the semiconductor wafer 10 with the array of conductive elements 12 formed thereon. The WLU material 30 at least partially covers the conductive elements 12 of the array.

Referring to FIG. 3, after the WLU material 30 is deposited over the semiconductor wafer 10, including at least partially over the conductive elements 12, the semiconductor wafer 10 is diced into individual semiconductor dice 11. Each semiconductor die 11 includes conductive elements 12 and WLU material 30 on a major surface thereof. Referring to FIG. 4, each semiconductor die 11 is positioned over a substrate 40, with the conductive elements 12 aligned with bond pads 42 of the substrate 40, and attached to the substrate 40 through a thermal compression process. The WLU material 30 melts and flows to fill the gap between the semiconductor die 11 and the substrate 40, and the WLU material 30 solidifies, which may involve curing, depending on the material of the WLU.

Ideally, the melted WLU material 30 flows off of each conductive element 12 during the bonding operation to enable an electrical interconnection to be made between the conductive elements 12 and the bond pads 42. However, a portion of the WLU material 30 often does not flow off of at least some of the conductive elements 12 and becomes entrapped between the conductive elements 12 and their associated bond pads 42. The entrapped WLU material 30 may increase electrical resistance across the electrical interconnection or cause the electrical interconnection to fail. Even a small amount of entrapped WLU material 30 may result in weakened joint integrity, which may result in early failure. Such defects may lower the performance of a device including the semiconductor die 11 and the substrate 40, or may even render the entire device inoperable. However, the WLU method enables application of underfill material to the entire semiconductor wafer 10, which saves time and cost of manufacturing when compared to methods that provide underfill material in a gap under individual semiconductor dice.

FIG. 5 through 7 illustrate a so-called "capillary underfill" (CUF) method of attaching the semiconductor die 11 to the substrate 40. In the conventional CUF method, the semiconductor die 11 is positioned over the substrate 40 such that the conductive elements 12 are aligned with the bond pads 42 of the substrate 40, as shown in FIG. 5. Referring to FIG. 6, the conductive elements 12 are placed in contact with the bond pads 42 and the semiconductor die 11 is thermally compressed against the substrate 40. Through the thermal compression, solder on the tips of the conductive elements 12 may melt to wet the bond pads 42 and form a physical and electrical interconnection. As shown in FIG. 7, after the solder is cooled and hardened, a relatively low-viscosity, liquid dielectric CUF material 32 is introduced into a gap between the semiconductor die 11 and the substrate 40 along one or more edges of the gap and is allowed to fill in the gap by wetting of surfaces and capillary action. The CUF material 32 flows between and around the conductive elements 12 and the bond pads 42, and the CUF material 32 is subsequently cured and hardened. The CUF method enables the electrical connections between the conductive elements 12 and the bond pads 42 to be free of entrapped underfill material, which improves the electrical connections and performance thereof. However, providing the CUF material 32 in the gaps under individual semiconductor dice 11 increases the time and cost of manufacturing compared to the WLU method. Furthermore, as semiconductor dice 11 and their respective conductive elements 12 are reduced in size, according to the well-known trend in the semiconductor industry toward smaller sizes, it becomes increasingly difficult to fill in the gap between the semiconductor dice 11 and the substrates 40 without voids. When present, voids in the CUF material 32 may decrease the reliability, performance, and physical stability of devices formed with the semiconductor dice 11 and associated substrates 40.

FIGS. 8 and 9 illustrate a so-called "non-conductive paste" (NCP) method of attaching the semiconductor die 11 to the substrate 40. In the conventional NCP method, the substrate 40 and the bond pads 42 thereon are at least partially covered by a dielectric NCP underfill material 34 and the conductive elements 12 on the semiconductor die 11 are aligned with the bond pads 42, as shown in FIG. 8. Referring to FIG. 9, the conductive elements 12 are thermally compressed against the bond pads 42 to melt the solder of the conductive elements 12 and to form an electrical interconnection. Similar to the WLU method described above, the NCP underfill material 34 ideally flows away from the interface between the conductive elements 12 and the associated bond pads 42. However, as shown in FIG. 9, at least some of the electrical interconnections may include entrapped NCP underfill material 36 between the conductive elements 12 and the bond pads 42. The high viscosity nature and presence of filler material in NCP increase the likelihood that NCP material will become entrapped. As discussed above, such entrapped NCP underfill material 36 may increase electrical resistance across the electrical interconnection, cause the electrical interconnection to fail, weaken joint integrity, and/or cause early failure. Such defects may lower the performance of a device including the semiconductor die 11 and the substrate 40, or may even render the entire device inoperable.

If any of the conventional methods described above are used with semiconductor dice 11 having so-called "thin substrates" (e.g., less than about 100 μm), the underfill material may have an increased likelihood of contaminating the back side of the semiconductor die 11. For example, during bonding, the underfill material may flow out of the gap and along a peripheral edge of the semiconductor die 11 and ultimately to the back side (e.g., the side of the semiconductor die 11 opposite the substrate 40) of the semiconductor die 11. With semiconductor dice 11 having a thin substrate, the vertical distance that the underfill material must travel to reach the back side is substantially shortened. Therefore, there is a smaller margin of error in determining the amount of underfill material required to fill the gap without allowing excess underfill material to reach the back side of the semiconductor die 11, consequently increasing the likelihood of the back side being contaminated by the underfill material.

DETAILED DESCRIPTION

Figure 1:
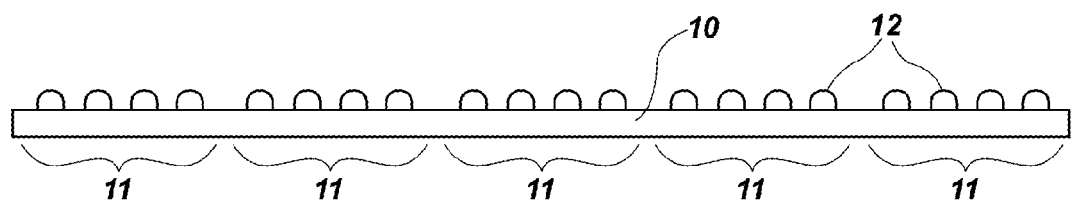
FIG. 1 through 4 illustrate a so-called "wafer level underfill" method of attaching a semiconductor die to a substrate.
Figure 2:
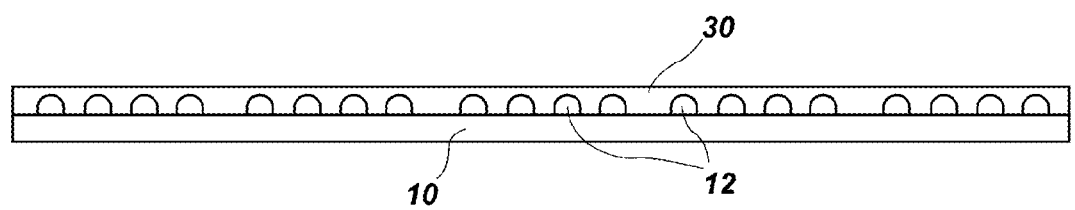
Figure 3:
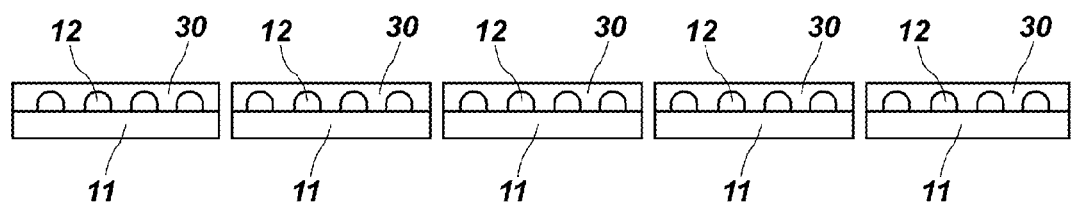
Figure 4:
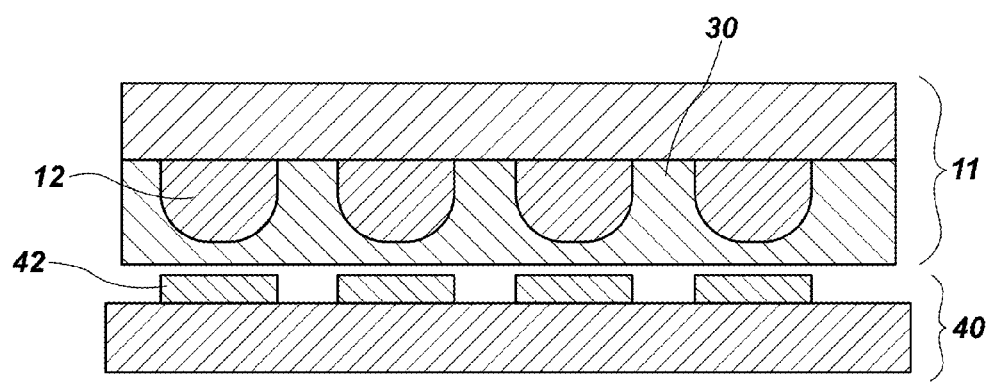
Figure 5:
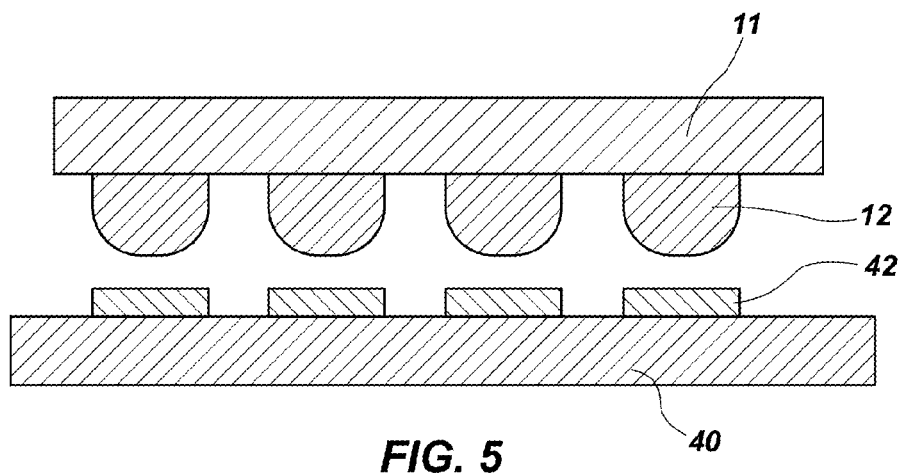
FIG. 5 through 7 illustrate a so-called "capillary underfill" method of attaching a semiconductor die to a substrate.
Figure 6:
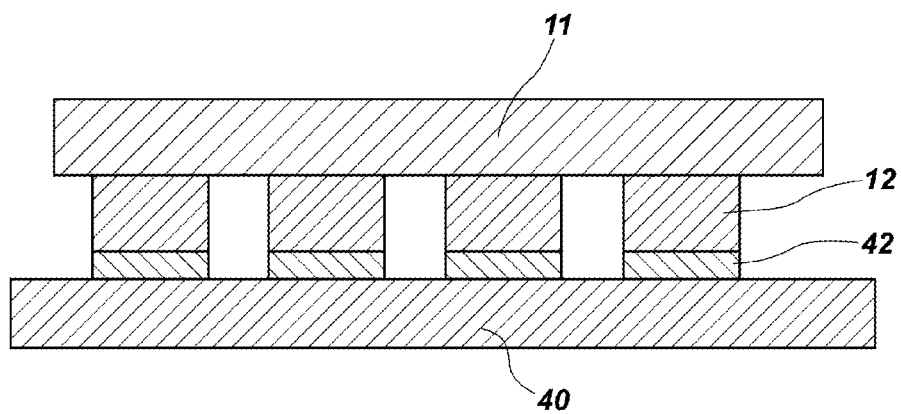
Figure 7:
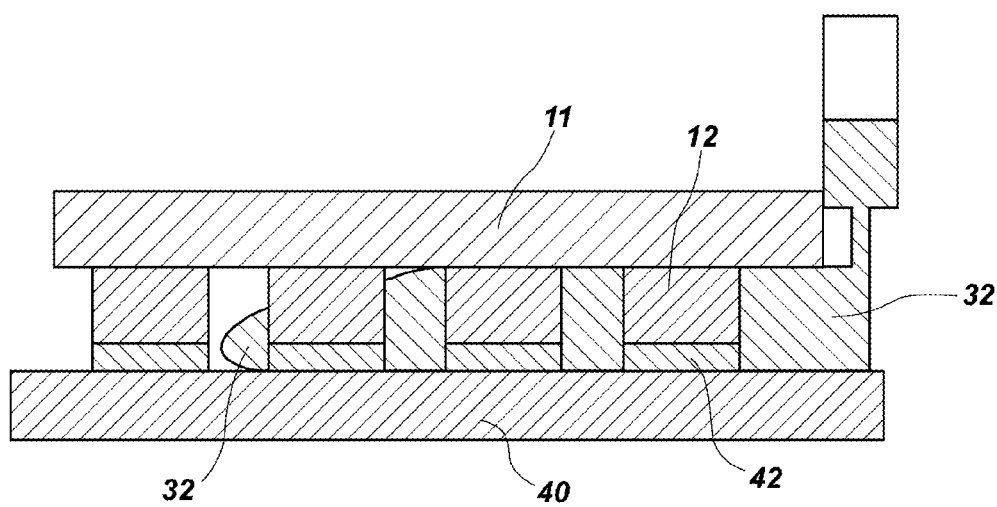
Figure 8:
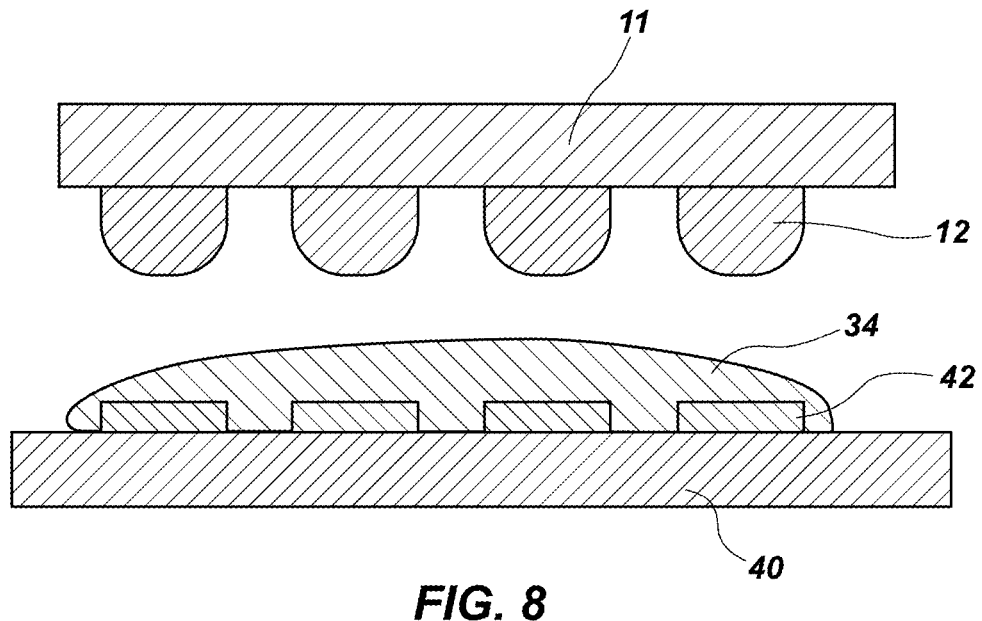
FIGS. 8 and 9 illustrate a so-called "non-conductive paste" method of attaching a semiconductor die to a substrate.
Figure 9:
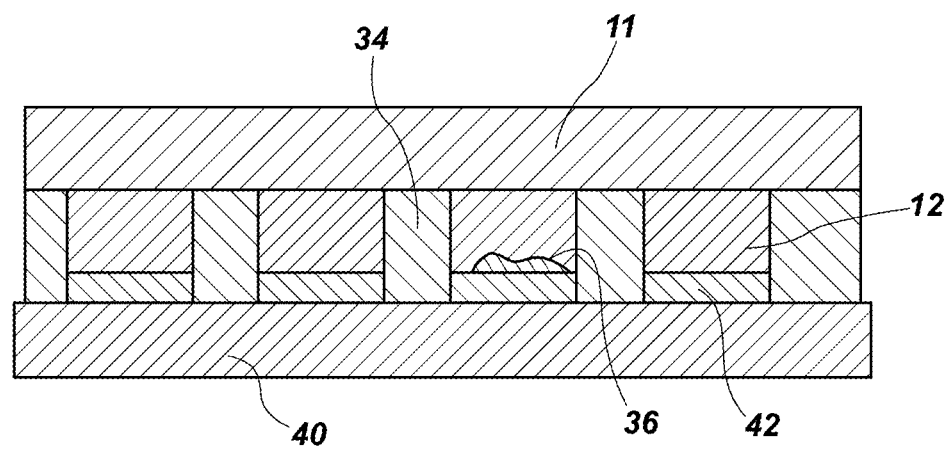

The following description provides specific details, such as material types and processing conditions, in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional fabrication techniques employed in the semiconductor industry.

In addition, the description provided below does not describe a complete process flow for forming semiconductor devices. The methods described below do not necessarily form complete semiconductor devices. The remainder of the process flow and semiconductor devices are known to those of ordinary skill in the art. Accordingly, only the methods and devices necessary to understand embodiments of the present disclosure are described in detail herein. Additional acts to form complete semiconductor devices and systems may be performed by conventional fabrication techniques known to those of ordinary skill in the art.

As used herein, any relational term, such as "first," "second," "over," etc., is used for clarity and convenience in understanding the present disclosure and accompanying drawings and does not connote or depend on any specific preference, orientation, or order, except where the context clearly indicates otherwise.

As used herein, the term "substantially," in reference to a given parameter, property, or condition, means and includes to a degree that one of ordinary skill in the art would understand that the given parameter, property, or condition is met within a degree of variance, such as within acceptable manufacturing tolerances.

As used herein, the term "conductive structures" means and includes structures on or protruding from a surface of a semiconductor die, semiconductor wafer, partial wafer, or other substrate, such as, without limitation an interposer, circuit board or other higher-level packaging and formed of one or more electrically conductive materials. Such conductive structures include, without limitation, conductive elements in the form of bumps, studs, columns or pillars, bond pads, redistributed bond pads, terminal pads, conductive lands and conductive leads.

In the following detailed description, reference is made to the accompanying drawings, which form a part of the present disclosure, and in which is shown, by way of illustration, specific embodiments in which the present disclosure may be practiced. These embodiments are described in sufficient detail to enable a person of ordinary skill in the art to practice the present disclosure. However, other embodiments may be utilized and structural and compositional changes may be made without departing from the scope of the present disclosure. The illustrations presented herein are not meant to be actual views of any particular system, device, structure, or memory cell, but are merely idealized representations which are employed to describe the embodiments of the present disclosure. The drawings presented herein are not necessarily drawn to scale. Additionally, elements common or similar between drawings may retain the same numerical designation.

The embodiments of the present disclosure include methods for forming a semiconductor device including at least one semiconductor die attached to a substrate. Electrical interconnections between the semiconductor die and the substrate may be provided through an array of conductive structures formed over a major surface of the semiconductor die aligned with a similar array of conductive structures formed over an opposing, major surface of the substrate. A photoimageable dielectric adhesive material may be applied to the semiconductor die and the conductive structures thereon. The photoimageable dielectric adhesive material over the conductive structures of the semiconductor die may be selectively removed, such as by a photolithography operation. By following the methods presently disclosed, each electrical interconnection may be at least substantially free of entrapped dielectric adhesive material, which, when present, is known to cause defects in the electrical interconnections. Furthermore, the gap between the semiconductor die and the substrate and between adjacent conductive structures may be substantially fully filled with the photoimageable dielectric adhesive material and, therefore, may be substantially free of voids.

Figure 10:
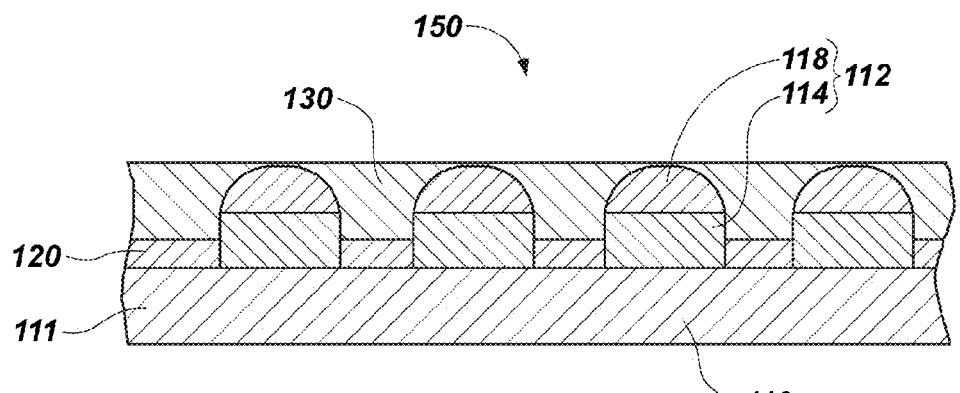
FIG. 10 through 14 illustrate a method of attaching a semiconductor die to a substrate according to an embodiment of the present disclosure.

FIG. 10 through 14 illustrate a method of attaching a semiconductor die 110 to a substrate 102 according to an embodiment of the present disclosure. FIG. 10 shows a portion of a semiconductor wafer 150 that may include a plurality of semiconductor dice 110. Although only a portion of the semiconductor wafer 150 is shown in FIG. 10 for clarity, it is to be understood that the semiconductor wafer 150 may include a plurality of individual semiconductor dice 110, with each semiconductor die 110 including a plurality of conductive elements 112 formed on a major surface thereof. As used herein, the phrase "major surface" means a surface generally parallel to a plane in which an object extends, such as the top surface of a substrate 111 of the semiconductor die 110 when viewed in the perspective of FIG. 10. For simplicity and clarity, four conductive elements 112 are shown on the semiconductor wafer 150. However, one of ordinary skill in the art will understand that each semiconductor die 110 of the semiconductor wafer 150 may include any number of conductive elements 112 formed thereon.

The semiconductor wafer 150 of the present disclosure is not limited to any particular semiconductor material. For example, the semiconductor wafer 150 may include a substrate that is silicon-based, germanium-based, silicon-germanium-based, gallium-arsenide-based, indium-gallium-arsenide-based, etc.

By way of example and not limitation, each semiconductor die 110 of the semiconductor wafer 150 may be or be a part of a memory device (e.g., a dynamic random access memory (DRAM) device, a NAND Flash memory device, a static random access memory (SRAM) device, a NOR memory device, etc.), a processor, an integrated circuit, a logic die, a complementary metal oxide semiconductor (CMOS) image sensor, a so-called "system on a chip," etc. Each semiconductor die of the semiconductor wafer 150 may be a so-called "flip-chip" with conductive structures in the form of conductive elements 112 protruding from an active surface thereof for physically and electrically connecting to a substrate, as will be explained in more detail below.

The plurality of conductive elements 112 may be operatively connected to electrical components (not shown) of the semiconductor die 110. For example, the conductive elements 112 may be electrically connected to integrated circuits comprising one or more of transistors, capacitors, diodes, word lines, bit lines, peripheral circuitry, conductive vias, etc., formed in the substrate 111. The conductive elements 112 may include any electrically conductive material or combination of electrically conductive materials. By way of example and not limitation, each conductive element 112 may include one or more of copper, nickel, gold, silver, tin, tungsten, platinum, indium, lead, solder (e.g., SnAg), etc. In one embodiment, each conductive element 112 may include, for example, a copper pillar 114 with a solder portion 118 formed on the copper pillar 114. A nickel material (not shown) may, optionally, be disposed between the copper pillar 114 and the solder portion 118. By way of another example, each conductive element 112 may be a copper pillar, a solder bump, or a gold stud bump. However, the present disclosure is not limited to such example embodiments. Rather, each conductive element 112 may include any sufficiently conductive material or combination thereof and have any appropriate structural form for a given application, as will be understood by one of ordinary skill in the art.

Each conductive element 112 may be formed by conventional techniques, such as, for example, one or more of sputtering, patterning, material removal (e.g., wet etching, dry etching, ablation, etc.), photolithography, chemical vapor deposition, physical vapor deposition, electrolytic plating, etc. The conductive elements 112 may be sized, configured, and arranged to provide electrical contact points for electrically connecting to bond pads or other conductive structures of a substrate, as will be explained in more detail below. In some embodiments, the conductive elements 112 may be so-called "fine pitch" conductive elements 112. For example, conductive elements 112 may be spaced at a pitch (e.g., center-to-center spacing of adjacent conductive elements) of about 100 µm or less. In some embodiments, conductive elements 112 may be spaced at a pitch of about 50 µm or less. It is contemplated that conductive elements 112 spaced at a pitch of 40 µm or even 30 µm will be employed in semiconductor devices in the foreseeable future. While the methods of the present disclosure may be suitable for use with fine pitch conductive elements 112, one of ordinary skill in the art will understand that the methods of the present disclosure may be also suitable for use with conductive elements of larger dimensions and at larger pitches, such as conductive elements at a pitch of larger than about 100 µm.

As shown in FIG. 10, a passivation material 120 may be formed over the substrate 111 to inhibit corrosion of or other environmental damage to the underlying substrate 111 and the components therein. By way of example and not limitation, the passivation material 120 may include at least one of an organic material (e.g., a polymer) and an inorganic material (e.g., an oxide or nitride). The conductive elements 112 may extend through openings in the passivation material 120 to provide electrical access to the components (not shown) of the semiconductor die 110.

After the conductive elements 112 are formed, a photoimageable dielectric adhesive material 130 may be applied to the semiconductor wafer 150. The photoimageable dielectric adhesive material 130 may include, for example, one or more of an epoxy material, an acrylate material, and a polyimide material. The photoimageable dielectric adhesive material 130 of the present disclosure may have a similar chemistry to conventional permanent photopolymer dielectric materials. Depending on the particular photoimageable dielectric adhesive material 130 used, the photoimageable dielectric adhesive material 130 may be applied by, for example, a lamination operation or a spin coating operation. For example, the photoimageable dielectric adhesive material 130 may, prior to application, be an at least semi-solid material in film form that may be applied by lamination. By way of example and not limitation, commercially available photoimageable dielectric adhesive materials 130 in film form that may be applied to the semiconductor wafer 150 by lamination include the following: IBF-X6069-20 and IBF-2095, each available from Sumitomo Bakelite Co., Ltd.; PerMX 3014, available from E. I. du Pont de Nemours and Company; and DF-XP107, available from Hitachi Chemical Co. America, Ltd. By way of another example, the photoimageable dielectric adhesive material 130 may, prior to application, be an at least semi-liquid, flowable material that may be applied by a spin coating operation. For example, commercially available photoimageable dielectric adhesive materials 130 that may be applied to the semiconductor wafer 150 by a spin coating operation include the following: InterVia Photodielectric 8023, available from Dow Chemical Company; XP7000, available from Hitachi DuPont Microsystems, LLC; PSA-S100, available from JSR Corporation; SINGR-3570PH, available from Shin-Etsu Chemical Co., Ltd.; and CPA-1000, available from Toray Industries, Inc.

In some embodiments, the semiconductor wafer 150 may comprise a so-called "thin substrate." For example, the thickness of the semiconductor wafer 150, not including the conductive elements 112, may be less than about 100 µm. In some embodiments, the semiconductor wafer 150 may have a thickness of less than about 60 µm. For example, the semiconductor wafer 150 may have a thickness of about 50 µm. To form such thin substrates, the semiconductor wafer 150 may be subjected to a wafer-thinning operation after the photoimageable dielectric adhesive material 130 is applied. In such embodiments, a carrier substrate (not shown) may be attached to the semiconductor wafer 150 with an adhesive (not shown) over the photoimageable dielectric adhesive material 130. The side of the semiconductor wafer 150 opposite the conductive elements 112 and the photoimageable dielectric adhesive material 130 may then be thinned, such as with an abrasive planarization operation, which may be implemented as a chemical mechanical planarization (CMP) operation. Therefore, if the semiconductor wafer 150 is to be thinned, the material of the photoimageable dielectric adhesive material 130 may be selected to be compatible with, and releasable from, the adhesive used to attach the carrier substrate.

After being applied to the surface of the semiconductor wafer 150, in some embodiments, the photoimageable dielectric adhesive material 130 may be heated to drive off excess solvent, as will be understood by one of ordinary skill in the art given a particular material used for the photoimageable dielectric adhesive material 130.

The photoimageable dielectric adhesive material 130 may substantially fully cover the major surface of the substrate 111 and may additionally cover at least some of the conductive elements 112. For example, the photoimageable dielectric adhesive material 130 may at least partially cover each solder portion 118 of the conductive elements 112. Although not shown in FIG. 10, even if an average thickness of the photoimageable dielectric adhesive material 130 is less than an average height of the conductive elements 112, some of the photoimageable dielectric adhesive material 130 may remain over the conductive elements 112.

Figure 11:
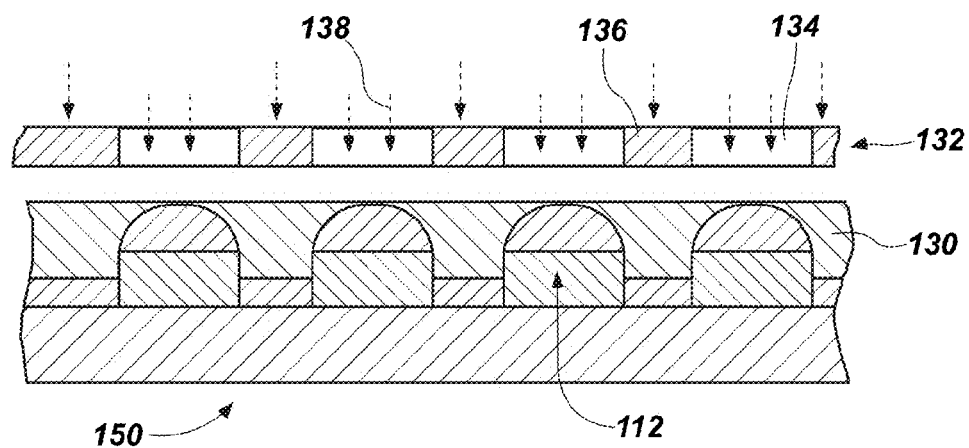

Referring to FIG. 11, the photoimageable dielectric adhesive material 130 covering the conductive elements 112 (e.g., covering the solder portions 118) may be removed by exposing and developing the photoimageable dielectric adhesive material 130 over the conductive elements 112, as is known in the art of photolithography. For example, a mask 132 may be positioned over the semiconductor wafer 150 such that apertures 134 (e.g., portions of the mask 132 that transmit light) are aligned with the conductive elements 112. A blocked region 136 of the mask 132 may be positioned over the area between the conductive elements 112, as shown in FIG. 11. The photoimageable dielectric adhesive material 130 over the conductive elements 112 may then be patterned by exposure to light 138 of a suitable wavelength (e.g., UV light) directed through the apertures 134. The blocked region 136 may inhibit the light 138 from exposing portions of the photoimageable dielectric adhesive material 130 between the conductive elements 112.

Figure 12:
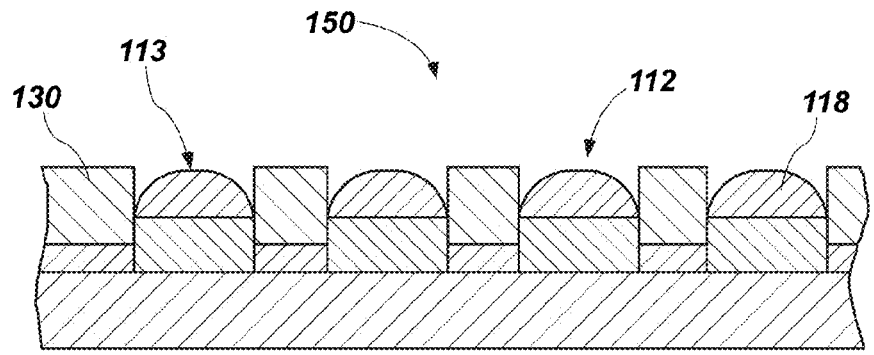

As shown in FIG. 12, the photoimageable dielectric adhesive material 130 may be developed by application of a suitable developer solution to remove the exposed portions of the photoimageable dielectric adhesive material 130 (FIG. 11). As a result, each of the conductive elements 112 may include a surface 113 (e.g., an upper surface of the solder portion 118) that is substantially free of the photoimageable dielectric adhesive material 130. Optionally, the semiconductor wafer 150 may be cleaned to remove particles and/or other surface contaminants after development of the photoimageable dielectric adhesive material 130.

Although the photoimageable dielectric adhesive material 130 has been described as a so-called "positive" material in which the exposed portions are removed when developed, the present disclosure is not so limited. In some embodiments, the photoimageable dielectric adhesive material 130 may be a so-called "negative" material in which the exposed portions remain on the semiconductor wafer 150 and the un-exposed portions are removed when developed, as will be appreciated by one of ordinary skill in the art. In such an instance, of course, the mask 132 would be configured for exposure of the portions of photoimageable dielectric adhesive material 130 between conductive elements 112, and the unexposed portions of photoimageable dielectric adhesive material 130 over conductive elements 112 would be dissolved by a suitable developer.

Figure 13:
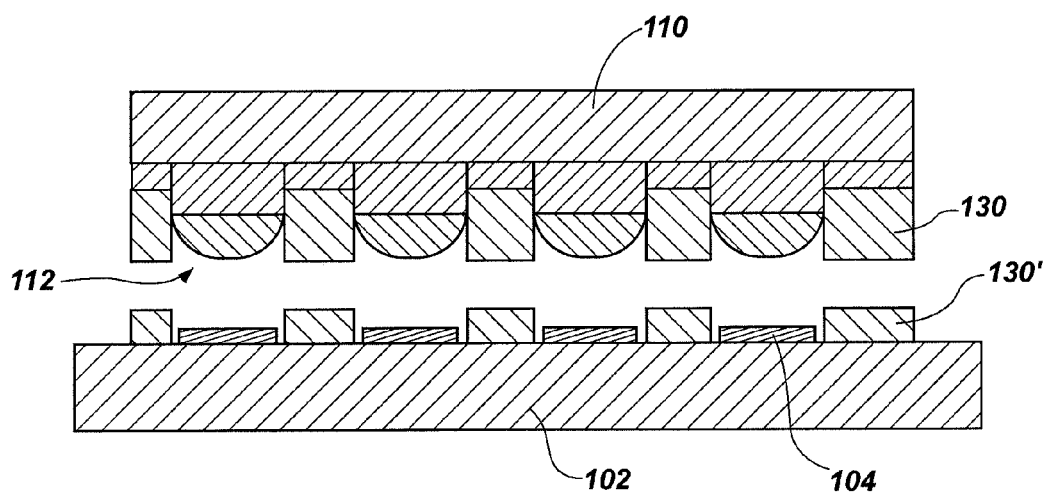

Referring to FIG. 13 in conjunction with FIG. 12, the semiconductor wafer 150 may be singulated to form a plurality of individual semiconductor dice 110 each having a plurality of conductive elements 112 each including a surface 113 that is substantially free of the photoimageable dielectric adhesive material 130, as described above. A semiconductor die 110 of the plurality of semiconductor dice 110 may be positioned over a substrate 102 having a plurality of conductive structures in the form of bond pads 104 formed on a major surface thereof. The protruding conductive elements 112 of the semiconductor die 110 may be aligned with the bond pads 104. In some embodiments, a portion of the photoimageable dielectric adhesive material 130 covering one or more alignment marks (not shown) on the semiconductor die 110 may be removed using the masking, exposure, and development operations described above, to facilitate the alignment of the conductive elements 112 with the bond pads 104.

The bond pads 104 on the substrate 102 may be formed in a pattern corresponding to the conductive elements 112 to enable each conductive element 112 to be aligned with a bond pad 104 of the plurality of bond pads 104. The substrate 102 may be any substrate to which the semiconductor die 110 may be physically and electrically connected through the conductive elements 112. By way of example and not limitation, the substrate 102 may be a printed circuit board (PCB), an interposer, another semiconductor die (e.g., a memory die, a logic die), etc. The bond pads 104 on the substrate 102 may include any electrically conductive material or combination of materials, as will be recognized by one of ordinary skill in the art. For example, the bond pads 104 may include at least one of copper, nickel, platinum, gold, solder (e.g., SnAg), tin, silver, tungsten, indium, etc.

Although FIG. 13 shows the conductive elements 112 being aligned with and connected to bond pads 104, the present disclosure is not so limited. One of ordinary skill in the art will recognize that the conductive elements 112 may, in some embodiments, be aligned with and connected to other elements, such as terminal pads, lands, leads, or circuit lines, for example.

As shown in FIG. 13, a second photoimageable dielectric adhesive material 130' (e.g., a second volume of photoimageable dielectric adhesive material) may be formed and patterned over the substrate 102 in a manner similar to that described above with reference to the photoimageable dielectric adhesive material 130 (e.g., a first photoimageable dielectric adhesive material 130; a first volume of photoimageable dielectric adhesive material) over the semiconductor wafer 150 of FIGS. 10 through 12. For example, the second photoimageable dielectric adhesive material 130' may be applied to the substrate 102, including over the bond pads 104, and subsequently patterned by exposure of the second photoimageable dielectric adhesive material 130' over the bond pads 104 through a mask, followed by development of the exposed second photoimageable dielectric adhesive material 130'. Therefore, the bond pads 104 may also have an upper surface that is substantially free of the second photoimageable dielectric adhesive material 130'. The combined thickness of the first photoimageable dielectric adhesive material 130 on the semiconductor die 110 and the second photoimageable dielectric adhesive material 130' on the substrate 102 may be selected such that, after bonding (described in more detail below), the first photoimageable dielectric adhesive material 130 and the second photoimageable dielectric adhesive material 130' fill substantially the entire gap between the semiconductor die 110 and the substrate 102 without impeding the formation of interconnections between the conductive elements 112 and the bond pads 104.

Although the semiconductor die 110 and the substrate 102 in FIG. 13 are both shown as including the first photoimageable dielectric adhesive material 130 and the second photoimageable dielectric adhesive material 130', respectively, being formed thereon, the disclosure is not so limited. Thus, the first photoimageable dielectric adhesive material 130 may be formed on only the semiconductor die 110 or the second photoimageable dielectric adhesive material 130' may be formed on only the substrate 102. In one embodiment, the second photoimageable dielectric adhesive material 130' may be formed on the substrate 102, and the first photoimageable dielectric adhesive material 130 may be omitted on the semiconductor die 110. The second photoimageable dielectric adhesive material 130' on the substrate 102 may have a thickness that is greater than the average height of the bond pads 104. Thus, a recess may be formed in the photoimageable dielectric adhesive material 130' over each bond pad 104. In such an embodiment, the conductive elements 112 may be capable of fitting at least partially into the recesses formed in the photoimageable dielectric adhesive material 130' over the bond pads 104. Such a capability may facilitate proper alignment of the semiconductor die 110 with the substrate 102, as the protruding conductive elements 112 may remain in place relative to the substrate 102 due to physical interference with walls of the recesses in the second photoimageable dielectric adhesive material 130' with the conductive elements 112 at least partially received therein.

In another embodiment, proper alignment may be similarly facilitated by forming the photoimageable dielectric adhesive material 130 on the semiconductor die 110 to have a thickness that is less than an average height of the conductive elements 112. Thus, the conductive elements 112 may extend away from the semiconductor die 110 more than the photoimageable dielectric adhesive material 130. When the semiconductor die 110 is placed over the substrate 102, the portion of the conductive elements 112 that extends beyond the thickness of the photoimageable dielectric adhesive material 130 on the semiconductor die 110 may fit into the recesses over the bond pads 104, as described above.

Although the present disclosure has been described with reference to the photoimageable dielectric adhesive material 130 being applied to the semiconductor wafer 150 and removed from over the conductive elements 112 at the wafer level, one of ordinary skill in the art will understand that improvements over conventional methods may be realized when processing the individual semiconductor dice 110, as well. For example, the photoimageable dielectric adhesive material 130 may be applied to individual semiconductor dice 110 and/or may be removed from over the conductive elements 112 after the semiconductor dice 110 have been singulated from the semiconductor wafer 150.

Figure 14:
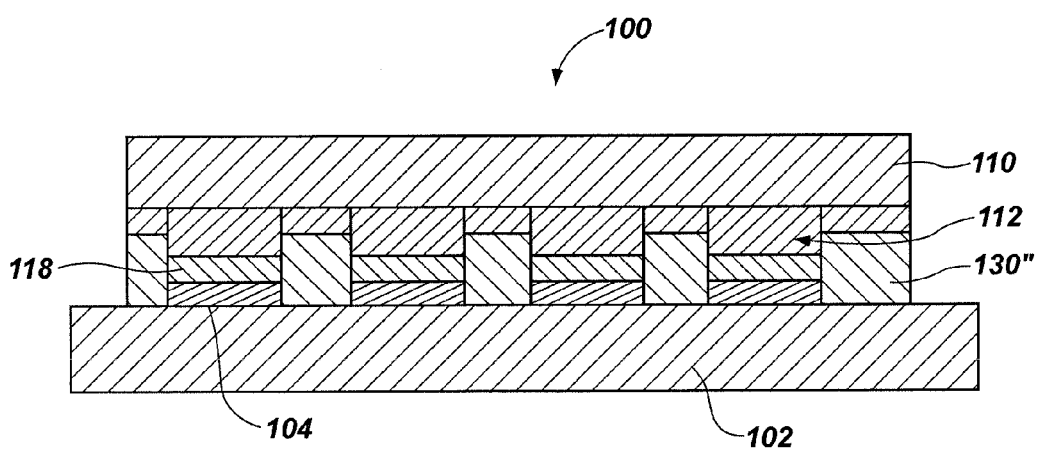

Referring to FIG. 14 in conjunction with FIG. 13, after the conductive elements 112 are aligned with the bond pads 104, the semiconductor die 110 and the substrate 102 may be thermally compressed together to form interconnections between the conductive elements 112 and the bond pads 104. As used herein, the phrase "thermally compress" means and includes pressing two elements together while subjecting the two elements to heat sufficient to melt at least a portion of the conductive elements 112 (e.g., the solder portion 118). The conductive elements 112 may be heated such that the solder portions 118 thereof melt to wet each associated bond pad 104 and to form a physical and electrical interconnection. The heat may also soften and even melt the first photoimageable dielectric adhesive material 130 and the second photoimageable dielectric adhesive material 130', forming a further physical, adhesive bond between the semiconductor die 110 and the substrate 102 that may be substantially free of voids and/or air pockets. The structure may be allowed to cool to harden and form a melted solder and bonded photoimageable dielectric adhesive material 130". In some instances, conductive elements 112 may not comprise a solder portion 118, and may be bonded to bond pads 104 by, for example, diffusion bonding or, in the case of the use of a conductive or conductor-filled epoxy, by adhesive bonding. In this manner, a semiconductor device package 100 may be formed that includes the semiconductor die 110 attached to the substrate 102 through the conductive elements 112 formed on a major surface of the semiconductor die 110. Since, prior to bonding, each of the conductive elements 112 and the bond pads 104 include surfaces that are substantially free of the first photoimageable dielectric adhesive material 130 (FIG. 13) and the second photoimageable dielectric adhesive material 130' (FIG. 13), each of the interconnections of the semiconductor device package 100 may lack any of the first photoimageable dielectric adhesive material 130 or the second photoimageable dielectric adhesive material 130' entrapped between the conductive elements 112 and the bond pads 104. In other words, each physical interface between the conductive elements 112 and the bond pads 104 may be characterized by a robust, uncompromised metal-to-metal or other conductor-to-conductor connection. Thus, semiconductor device packages 100 formed by the methods of the present disclosure may exhibit improved yield, reliability, structural integrity, and performance compared to semiconductor devices formed by conventional methods, while maintaining a relatively low cost of manufacturing.

Accordingly, the present disclosure includes a method for forming a semiconductor device package. The method may include applying a photoimageable dielectric adhesive material to a major surface of a semiconductor die and at least partially over conductive elements on the semiconductor die. The photoimageable dielectric adhesive material over the conductive elements may be removed, and the conductive elements of the semiconductor die may be respectively aligned with bond pads of a substrate. The method may also include bonding the conductive elements with the bond pads to physically and electrically couple the conductive elements with the bond pads and adhering the semiconductor die to the substrate with the photoimageable dielectric adhesive material.

In addition, the present disclosure includes another method for forming a semiconductor device package. A photoimageable dielectric adhesive material may be applied to a major surface of a semiconductor wafer including semiconductor dice each having conductive structures on a major surface thereof and at least partially over the conductive structures. The photoimageable dielectric adhesive material may be selectively exposed through a mask and developed to remove the photoimageable dielectric adhesive material from over the conductive structures. The conductive structures of the semiconductor dice may be aligned with conductive structures of a substrate, and the semiconductor dice may be placed against the substrate to provide physical and electrical contact between conductive structures of the semiconductor dice and the aligned conductive structures of the substrate. The semiconductor dice may be adhered to the substrate with the developed photoimageable dielectric adhesive material.

Furthermore, the present disclosure includes a semiconductor device package, which may include at least one semiconductor die and a substrate. The at least one semiconductor die may include conductive structures on a major surface thereof and the substrate may include bond pads on a major surface thereof. The bond pads may be physically and electrically connected to the conductive structures. A developed photoimageable dielectric adhesive material may be disposed between the at least one semiconductor die and the substrate around and between adjacent conductive structures.

Figure 15:
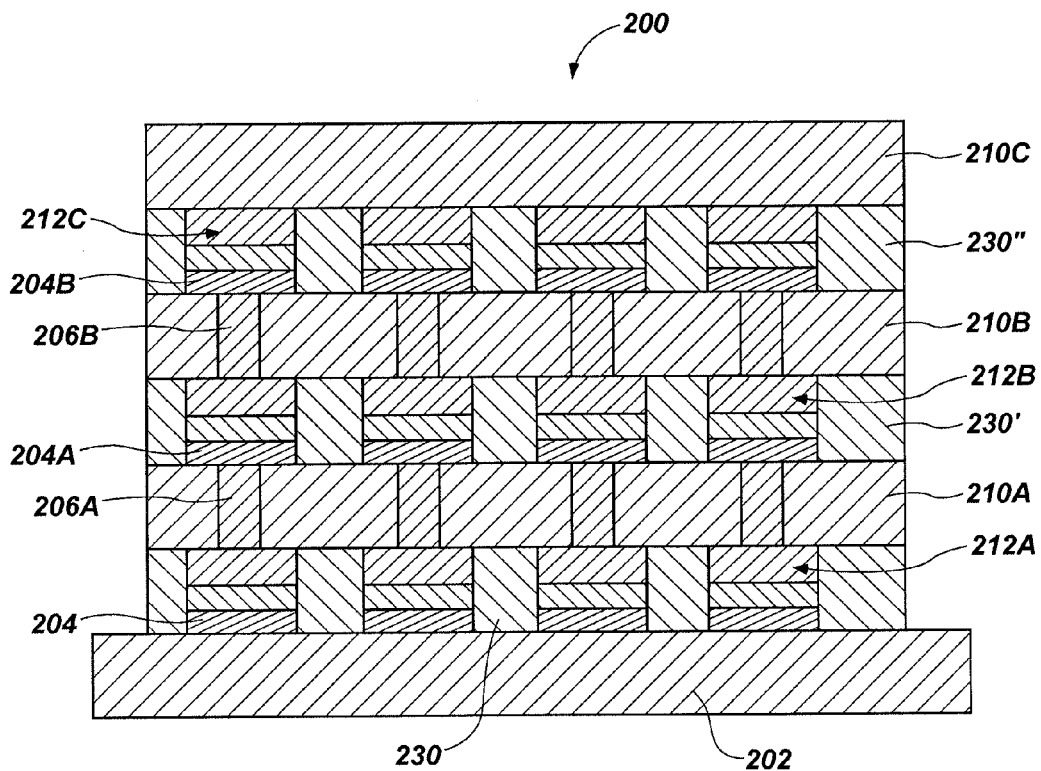
FIG. 15 shows a partial cross-sectional view of an embodiment of a semiconductor device package of the present disclosure.

FIG. 15 shows a partial cross-sectional view of an embodiment of a semiconductor device package 200 according to the present disclosure. As shown in FIG. 15, the semiconductor device package 200 may include multiple semiconductor dice (e.g., first, second, and third semiconductor dice 210A, 210B, and 210C, respectively), which may be stacked and attached to a substrate 202. Gaps between the first semiconductor die 210A and the substrate 202 may be filled with a first photoimageable dielectric material 230, gaps between the first semiconductor die 210A and the second semiconductor die 210B may be filled with a second photoimageable dielectric adhesive material 230', and gaps between the second semiconductor die 210B and the third semiconductor die 210C may be filled with a third photoimageable dielectric adhesive material 230", as described above with reference to the first photoimageable dielectric adhesive material 130 and the second photoimageable dielectric adhesive material 130'. The substrate 202 may be essentially the same as described above with reference to the substrate 102. For example, the substrate 202 may include a plurality of bond pads 204 formed on a major surface thereof, similar to the bond pads 104 described above.

The first semiconductor die 210A may be similar to the semiconductor die 110 described above. For example, the first semiconductor die 210A may include a plurality of first conductive elements 212A on a major surface thereof, and the first photoimageable dielectric adhesive material 230 may be disposed over the first semiconductor die 210A and between adjacent first conductive elements 212A. The first semiconductor die 210A may, in some embodiments, additionally include a plurality of first conductive vias 206A extending through the first semiconductor die 210A from the first conductive elements 212A to a plurality of first bond pads 204A formed on an opposite side of the first semiconductor die 210A. Thus, the first semiconductor die 210A may be referred to as a "through-silicon via" (TSV) die.

The first semiconductor die 210A may be attached to the substrate 202 in essentially the same manner as described above with reference to the semiconductor die 110 being attached to the substrate 102. For example, the first photoimageable dielectric adhesive material 230 may be exposed and developed to be removed from over first conductive elements 212A on the first semiconductor die 210A. The first conductive elements 212A may be aligned with the bond pads 204, and the first semiconductor die 210A may be placed over the substrate 202. In some embodiments, the first semiconductor die 210A may be positioned against the substrate 202 to form electrical interconnections between the first conductive elements 212A and the bond pads 204 of the substrate 202 by thermal compression or other bonding technique and to substantially fully fill the gap between the first semiconductor die 210A and the substrate 202 with the first photoimageable dielectric adhesive material 230.

The second semiconductor die 210B may be substantially similar to the first semiconductor die 210A, in that the second semiconductor die 210B may include a plurality of second conductive elements 212B formed on a major surface thereof, a plurality of second conductive vias 206B extending through the second semiconductor die 210B from the second conductive elements 212B to a plurality of second bond pads 204B on an opposite side of the second semiconductor die 210B, and the second photoimageable dielectric adhesive material 230' formed on a major surface thereof between adjacent second conductive elements 212B. The second conductive elements 212B of the second semiconductor die 210B may be attached to the first bond pads 204A of the first semiconductor die 210A, as described above. In other words, the first semiconductor die 210A may act as a substrate to which the second semiconductor die 210B is attached.

The third semiconductor die 210C may be substantially similar to the first and second semiconductor dice 210A and 210B and may include a plurality of third conductive elements 212C on a major surface thereof that have a surface that is substantially free of the second photoimageable dielectric adhesive material 230". In some embodiments, such as that shown in FIG. 15, the third semiconductor die 210C may not include conductive vias and bond pads. However, in other embodiments (not shown), the third semiconductor die 210C may include conductive vias and/or bond pads essentially as described above with reference to the first and second semiconductor dice 210A and 210B. The third conductive elements 212C may be attached to the second bond pads 204B, as described above. For example, the third conductive elements 212C may be aligned with the associated second bond pads 204B and the third semiconductor device 210C may be positioned against, and physically and electrically connected to, the second semiconductor die 210B. In other words, the second semiconductor die 210B may act as a substrate to which the third semiconductor die 210C is attached.

Although the bonding operation used to form the semiconductor device package 200 including the plurality of semiconductor dice 210A, 210B, and 210C has been described as including thermally compressing or otherwise bonding each semiconductor die 210A, 210B, and 210C to the underlying substrate 202 one at a time, the present disclosure is not so limited. For example, multiple semiconductor dice may be positioned (e.g., stacked) over the substrate 202 and may be simultaneously heated and compressed or otherwise caused to electrically and physically bond all of the multiple semiconductor dice to each other and to the substrate 202 simultaneously. Thus, any number of semiconductor dice may be substantially simultaneously attached to the substrate 202, which may reduce the time and expense required to form one or more semiconductor device packages 200.

Although the semiconductor device package 200 depicted in FIG. 15 includes three semiconductor dice 210A, 210B, and 210C attached to the substrate 202, the present disclosure is not so limited. For example, the semiconductor device package 200 may include one, two, three, four, eight, or any other number of semiconductor dice in a given application, as will be appreciated by one of ordinary skill in the art.

Methods of the present disclosure may be used to attach semiconductor dice having a high pin count, fine pitch conductive structures to a substrate with a thin bond line between the components, while at least substantially avoiding electrical interconnections that suffer from defects of entrapped underfill material and without the presence of voids in the dielectric material disposed between the components. The methods of the present disclosure may save time and, therefore, cost when compared to methods in which underfill material is formed over individual semiconductor dice after singulation and compared to methods in which underfill material is introduced between a semiconductor die and a substrate (e.g., CUF methods). Additionally, yield and reliability of semiconductor device packages formed by the methods of the present disclosure may be improved over conventional WLU or NCP methods, due to the absence of entrapped underfill material in the electrical interconnections of the present disclosure. Furthermore, the photoimageable dielectric adhesive material of the present disclosure may be applied to the semiconductor wafer with better uniformity and control compared to a conventional underfill material, and the application techniques involve less mechanical stress to fine pitch conductive structures than application of WLU or NCP materials. When thin semiconductor substrates are employed, such uniformity and control may enable a reduced likelihood of back side contamination by excess underfill material as well as less mechanical stress on the substrates. In addition, the photoimageable dielectric adhesive material of the present disclosure may exhibit better thermal stability than conventional underfill materials and, therefore, may be used in process flows that include heating operations (e.g., curing operations, material application operations involving heat, etc.) after forming, selectively exposing, and developing the photoimageable dielectric adhesive material on a semiconductor wafer or die.

Figure 16:
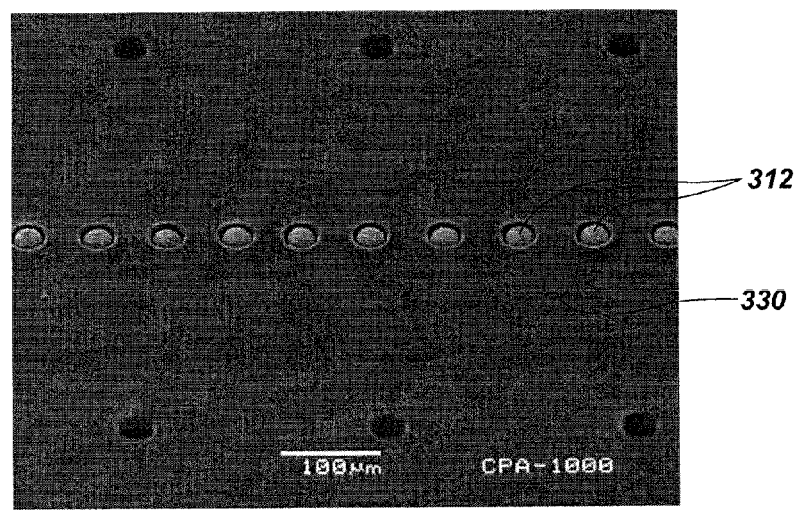
FIG. 16 shows an enlarged perspective image of a portion of a semiconductor die, wherein a photoimageable dielectric adhesive material has been removed from over conductive elements according to a method of the present disclosure.
Figure 17:
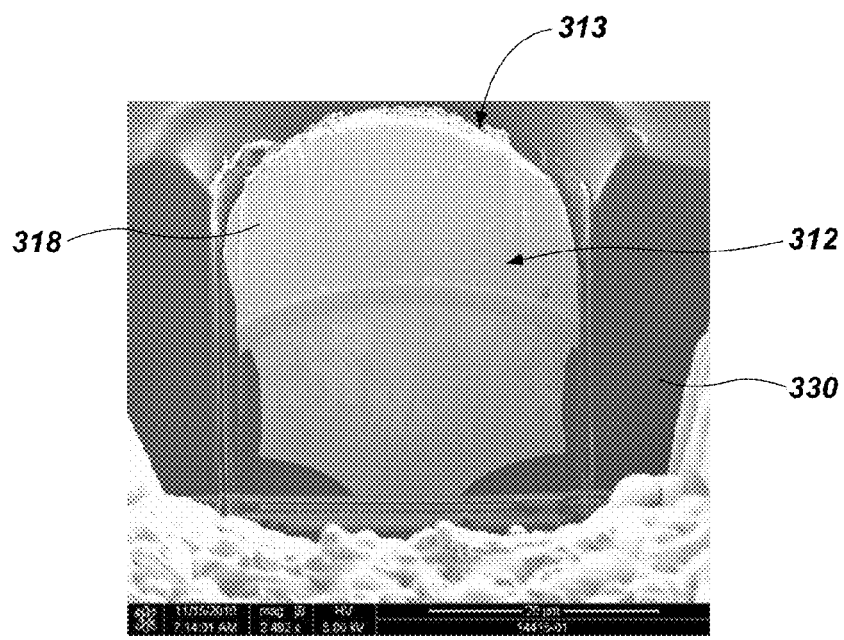
FIG. 17 shows an enlarged image of a cross-section of a conductive element similar to the conductive elements of FIG. 16.

FIGS. 16 and 17 show enlarged images of a portion of a semiconductor wafer and of a cross-section of a conductive element 312, respectively, prepared according to a method of the present disclosure. Referring to FIGS. 16 and 17, a photoimageable dielectric adhesive material 330 was applied over a semiconductor wafer and at least partially over the conductive elements 312 formed on the surface of the semiconductor wafer. As described above, the photoimageable dielectric adhesive material 330 over the conductive elements 312 was exposed through a mask and developed to remove the photoimageable dielectric adhesive material 330 from over the conductive elements 312 and provide individual recesses within which conductive elements 312 reside. As shown in FIG. 17, a solder portion 318 of the conductive element 312 includes a surface 313 that is at least substantially free of the photoimageable dielectric adhesive material 330. Also as shown in FIG. 17, walls of the recesses about each conductive element 312 may be precisely dimensioned, substantially cylindrical, substantially vertical and removed from a lateral periphery of the conductive elements 312.

Figure 18:
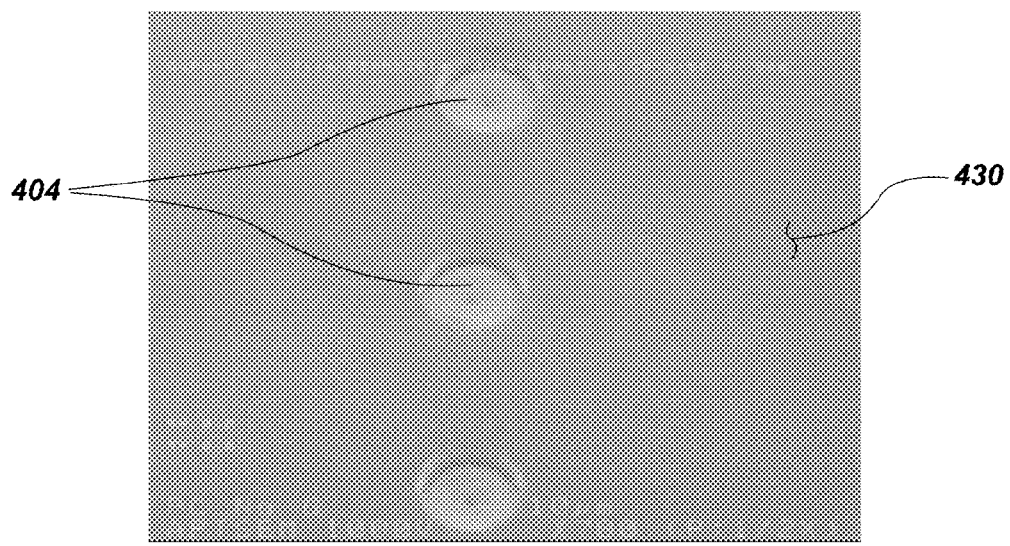
FIG. 18 shows an enlarged perspective image of a portion of a substrate, wherein a photoimageable dielectric adhesive material has been removed from over bond pads according to a method of the present disclosure.
Figure 19:
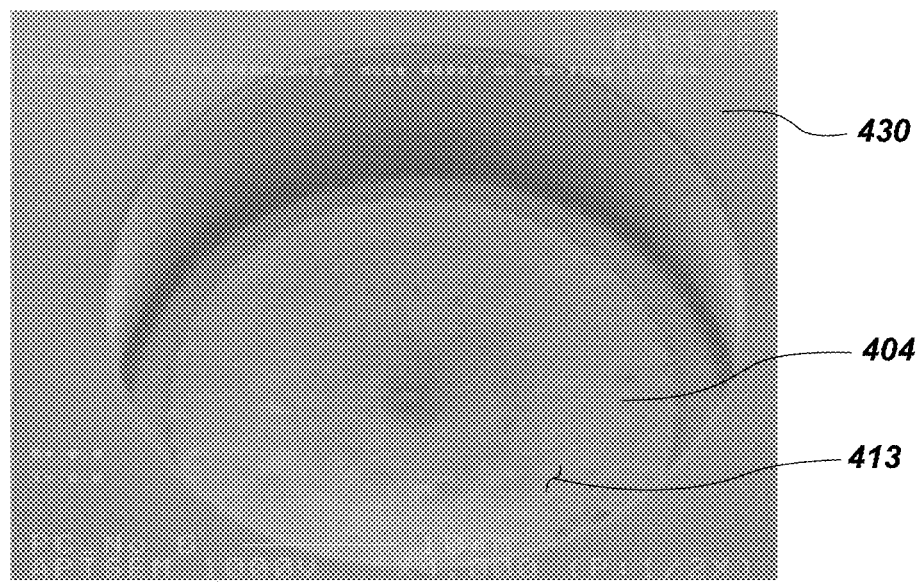
FIG. 19 shows an enlarged perspective image of a bond pad similar to the bond pads of FIG. 18.

FIGS. 18 and 19 show enlarged perspective images of a portion of a substrate and of a bond pad 404, respectively, prepared according to a method of the present disclosure. Referring to FIGS. 18 and 19, a photoimageable dielectric adhesive material 430 was applied over the substrate and at least partially over the bond pads 404 formed on the surface of the substrate. As described above, the photoimageable dielectric adhesive material 430 over the bond pads 404 was exposed through a mask and developed to remove the photoimageable dielectric adhesive material 430 from over the bond pads 404. As shown in FIG. 19, each bond pad 404 includes a surface 413 that is at least substantially free of the photoimageable dielectric adhesive material 430. Furthermore, a recess is formed in the photoimageable dielectric adhesive material 430 immediately over the bond pad 404 and, as depicted in FIG. 19, walls of the recess may be laterally removed from a periphery of bond pad 404. A portion of a conductive element of a semiconductor die may be at least partially disposed in the recess during a subsequent bonding operation to facilitate the alignment of the semiconductor die with the substrate.

Figure 20:
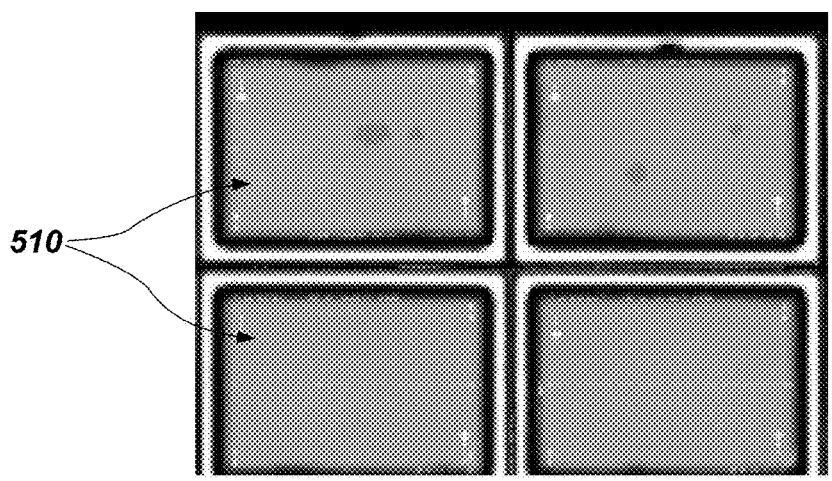
FIG. 20 shows a C-mode scanning acoustic microscope (C-SAM) image taken of four semiconductor dice attached to a substrate according to a method of the present disclosure.

FIG. 20 shows a C-mode scanning acoustic microscope (C-SAM) image taken of four semiconductor dice 510 attached to a substrate according to a method of the present disclosure. Typically, a C-SAM image of a semiconductor die attached to a substrate shows any void in the adhesive material (e.g., underfill material, NCP material) between the semiconductor die and the substrate as a discoloration. The lack of such discoloration in the C-SAM image of FIG. 20 illustrates that a semiconductor device package formed by a method of the present disclosure avoids substantially all voids in the adhesive material between the semiconductor die 510 and the substrate.

While the present disclosure is susceptible to various modifications and alternative forms, specific embodiments have been shown by way of example in the figures and have been described in detail herein. However, the invention of the present disclosure is not intended to be limited to the particular forms disclosed. Rather, the invention encompasses all modifications, combinations, equivalents, and alternatives falling within the scope defined by the following appended claims and their legal equivalents.

What is claimed is:

1. A method for forming a semiconductor device package, the method comprising:
   applying a first photoimageable dielectric adhesive material to a major surface of a semiconductor die and at least partially over conductive elements protruding from the major surface of the semiconductor die;
   removing the first photoimageable dielectric adhesive material from over the conductive elements;
   applying a second photoimageable dielectric adhesive material to a major surface of a substrate and at least partially over bond pads of the substrate;
   removing the second photoimageable dielectric adhesive material from over the bond pads of the substrate;
   respectively aligning the conductive elements of the semiconductor die with bond pads of the substrate;
   bonding the conductive elements of the semiconductor die with the bond pads of the substrate to physically and electrically couple the conductive elements with the bond pads; and
   adhering the semiconductor die to the substrate with the first photoimageable dielectric adhesive material and the second photoimageable dielectric adhesive material.

2. The method of claim 1, wherein bonding comprises:
   applying thermocompression to cause a portion of each conductive element to physically and electrically couple to an associated bond pad; and
   at least partially melting the first photoimageable dielectric adhesive material and the second photoimageable dielectric adhesive material.

3. The method of claim 2, wherein applying thermocompression comprises melting solder portions of the conductive elements and cooling the solder portions, the first photoimageable dielectric adhesive material, and the second photoimageable dielectric adhesive material to solidify the solder, the first photoimageable dielectric adhesive material, and the second photoimageable dielectric adhesive material to form physical and electrical connections between the conductive elements and the bond pads.

4. The method of claim 1, further comprising:
   aligning conductive elements of another semiconductor die with bond pads on an opposing major surface of the semiconductor die; and
   bonding the conductive elements of the another semiconductor die against the bond pads of the semiconductor die to physically and electrically couple the conductive elements with the bond pads.

5. The method of claim 4, wherein bonding the conductive elements of the semiconductor die with the bond pads of the substrate and bonding the conductive elements of the another semiconductor die with the bond pads of the semiconductor die to physically and electrically couple conductive elements with bond pads are performed simultaneously.

6. The method of claim 1, wherein applying the first photoimageable dielectric adhesive material to a major surface of a semiconductor die comprises applying the first photoimageable dielectric adhesive material to a major surface of a semiconductor wafer comprising the semiconductor die and a plurality of other semiconductor dice.

7. The method of claim 1, wherein removing the first photoimageable dielectric adhesive material from over the conductive elements comprises:
   selectively exposing the first photoimageable dielectric adhesive material over either the conductive elements or over areas between the conductive elements to light through a mask; and
   developing the photoimageable dielectric adhesive material to remove portions of the photoimageable dielectric adhesive material in a soluble state after the selective exposure.

8. The method of claim 1, wherein removing the second photoimageable dielectric adhesive material from over the bond pads comprises removing portions of the second photoimageable dielectric adhesive material from a lateral periphery of the bond pads protruding from the major surface of the substrate.

9. The method of claim 8, further comprising disposing portions of the conductive elements within recesses formed in the second photoimageable dielectric adhesive material over associated bond pads prior to the bonding.

10. The method of claim 1, wherein applying the first photoimageable dielectric adhesive material to a major surface of a semiconductor die and at least partially over conductive elements on the semiconductor die comprises applying one or more of a photoimageable epoxy material, a photoimageable acrylate material, and a photoimageable polyimide material to the major surface of the semiconductor die and at least partially over the conductive elements on the semiconductor die.

11. A method for forming a semiconductor device package, the method comprising:
   applying a first photoimageable dielectric adhesive material to a major surface of a semiconductor wafer including semiconductor dice each having conductive structures protruding from a major surface thereof and at least partially over the conductive structures;
   selectively exposing through a mask and developing the first photoimageable dielectric adhesive material to remove portions of the first photoimageable dielectric adhesive material from over the conductive structures;
   applying a second photoimageable dielectric adhesive material to a major surface of a substrate and at least partially over conductive structures of the substrate;
   removing portions of the second photoimageable dielectric adhesive material from over the conductive structures of the substrate;
   aligning the conductive structures of the semiconductor dice with the conductive structures of the substrate;
   placing the semiconductor dice against the substrate to provide physical and electrical contact between the conductive structures of the semiconductor dice and the aligned conductive structures of the substrate; and
   adhering the semiconductor dice to the substrate with the developed first photoimageable dielectric adhesive material and the second photoimageable dielectric adhesive material.

12. The method of claim 11, wherein applying the first photoimageable dielectric adhesive material to the major surface of a semiconductor wafer including semiconductor dice each having conductive structures protruding from a major surface thereof comprises applying the first photoimageable dielectric adhesive material to the major surface of a semiconductor wafer including semiconductor dice each having conductive structures at a pitch of about 100 µm or less on a major surface thereof.

13. The method of claim 11, wherein applying the first photoimageable dielectric adhesive material to the major surface of the semiconductor wafer comprises at least one of laminating a film of the first photoimageable dielectric adhesive material and spin coating the first photoimageable dielectric adhesive material over the major surface of the semiconductor wafer.

14. The method of claim 11, wherein applying the first photoimageable dielectric adhesive material to a major surface of a semiconductor wafer comprises applying the first photoimageable dielectric adhesive material to a semiconductor wafer having a semiconductor substrate exhibiting a thickness of less than about 100 µm.

15. The method of claim 11, wherein aligning the conductive structures of the semiconductor dice with the conductive structures of the substrate comprises aligning the semiconductor wafer with the substrate.

16. A semiconductor device package, comprising:
   at least one semiconductor die including conductive structures protruding from a first major surface thereof;
   a substrate including bond pads protruding from a major surface thereof, the bond pads physically and electrically connected to the conductive structures;
   a first developed photoimageable dielectric adhesive material disposed between the at least one semiconductor die and the substrate around and between adjacent conductive structures and around and between the bond pads;
   at least one other semiconductor die including conductive structures on a major surface thereof stacked on a second major surface of the at least one semiconductor die opposing the first major surface thereof, the at least one semiconductor die including bond pads on the second major surface thereof, the bond pads physically and electrically connected to the conductive structures of the at least one other semiconductor die; and
   a second developed photoimageable dielectric adhesive material disposed between the at least one semiconductor die and the at least one other semiconductor die around and between adjacent conductive structures of the at least one other semiconductor die.

17. The semiconductor device package of claim 16, wherein the conductive structures protruding from the first major surface of the at least one semiconductor die are located at a pitch of about 100 µm or less.

18. The semiconductor device package of claim 17, wherein the conductive structures protruding from the first major surface of the at least one semiconductor die are located at a pitch of about 50 µm or less.

19. The semiconductor device package of claim 16, wherein the conductive structures protruding from the first major surface of the at least one semiconductor die each comprise at least one of copper, nickel, gold, silver, tin, tungsten, platinum, indium, lead, and solder.

20. The semiconductor device package of claim 16, wherein the at least one semiconductor die comprises a plurality of semiconductor dice.

21. The semiconductor device package of claim 20, wherein the at least one semiconductor die comprises a plurality of semiconductor dice in unsingulated wafer form.

22. The semiconductor device package of claim 16, wherein the at least one semiconductor die comprises a substrate having a thickness of about 100 μm or less.

23. The semiconductor device package of claim 22, wherein the at least one semiconductor die comprises a substrate having a thickness of about 50 μm or less.

24. The semiconductor device package of claim 16, wherein the at least one semiconductor die comprises conductive vias extending through a substrate thereof, each conductive via in electrical contact with a conductive structure on the first major surface of the at least one semiconductor die and in electrical contact with a bond pad on the second major surface of the at least one semiconductor die.

25. The semiconductor device package of claim 16, wherein an interface between each connected conductive structure and bond pad is free of the first developed photoimageable dielectric adhesive material and of the second developed photoimageable dielectric adhesive material.

26. The semiconductor device package of claim 16, where the first developed photoimageable dielectric adhesive material is selected from the group consisting of an epoxy material, an acrylate material, and a polyimide material.

\* \* \* \* \*